US009838575B2

(12) United States Patent
Kakuma

(10) Patent No.: US 9,838,575 B2
(45) Date of Patent: Dec. 5, 2017

(54) FLOW-DOWN DETERMINATION METHOD, FLOW-DOWN DETERMINATION APPARATUS AND DISCHARGE APPARATUS

(71) Applicant: SCREEN Holdings Co., Ltd., Kyoto (JP)

(72) Inventor: Hiroaki Kakuma, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/208,085

(22) Filed: Jul. 12, 2016

(65) Prior Publication Data

US 2017/0028426 A1    Feb. 2, 2017

(30) Foreign Application Priority Data

Jul. 29, 2015   (JP) .................................. 2015-149633

(51) Int. Cl.
| | |
|---|---|
| *G06K 9/00* | (2006.01) |
| *H04N 5/225* | (2006.01) |
| *G01F 1/708* | (2006.01) |
| *G06T 7/20* | (2017.01) |
| *H01L 21/67* | (2006.01) |

(Continued)

(52) U.S. Cl.
CPC ......... *H04N 5/2251* (2013.01); *G01F 1/7086* (2013.01); *G01P 13/0006* (2013.01); *G06T 7/20* (2013.01); *H01L 21/6715* (2013.01); *H01L 21/67253* (2013.01)

(58) Field of Classification Search
USPC ....... 382/100, 103, 106–108, 123, 141, 149, 382/162, 168, 172, 173, 181, 189, 194, 382/199, 219, 232, 254, 274, 276, 286, 382/305, 312; 396/611; 427/273; 216/85, 84; 118/300

See application file for complete search history.

(56) References Cited

U.S. PATENT DOCUMENTS

| | | | | |
|---|---|---|---|---|
| 2002/0124798 A1* | 9/2002 | Kitano | ...................... | G03F 7/16 118/300 |
| 2011/0286738 A1* | 11/2011 | Noda | ................ | H01L 21/67253 396/611 |

(Continued)

FOREIGN PATENT DOCUMENTS

| | | |
|---|---|---|
| JP | 2002-316080 | 10/2002 |
| JP | 2009-095826 | 5/2009 |

(Continued)

OTHER PUBLICATIONS

Office Action dated Aug. 31, 2017 for corresponding Taiwanese Patent Application No. 105121741.

*Primary Examiner* — Seyed Azarian
(74) *Attorney, Agent, or Firm* — Ostrolenk Faber LLP

(57) ABSTRACT

Imaging is performed such that a flow-down path of the liquid from the nozzle arranged above a work to an upper surface of the work is included in an imaging field of view (Step S401). A total value of pixel values of pixels belonging to each pixel column composed of the pixels arranged in a line along a flow-down direction of the liquid in an evaluation region corresponding to the flow-down path out of an imaged image is calculated (Step S402-S403). Based on a change mode of the total value in an orthogonal direction orthogonal to the flow-down direction, presence or absence of the flow-down of the liquid is determined (Step S405-S407).

5 Claims, 15 Drawing Sheets

(51) Int. Cl.
*G01P 13/00* (2006.01)
*C03C 15/00* (2006.01)

(56) References Cited

U.S. PATENT DOCUMENTS

| | | | |
|---|---|---|---|
| 2012/0051656 A1 | 3/2012 | Wang et al. ............... 382/201 |
| 2013/0084393 A1* | 4/2013 | Kashiyama ......... H01L 21/6715 |
| | | | 427/273 |
| 2014/0124479 A1* | 5/2014 | Tomita .............. H01L 21/02087 |
| | | | 216/85 |

FOREIGN PATENT DOCUMENTS

| JP | 2012-009812 | 1/2012 |
| JP | 2013-206983 | 10/2013 |
| TW | 201209758 A | 3/2012 |
| TW | 201435331 A | 9/2014 |

* cited by examiner

F I G. 3
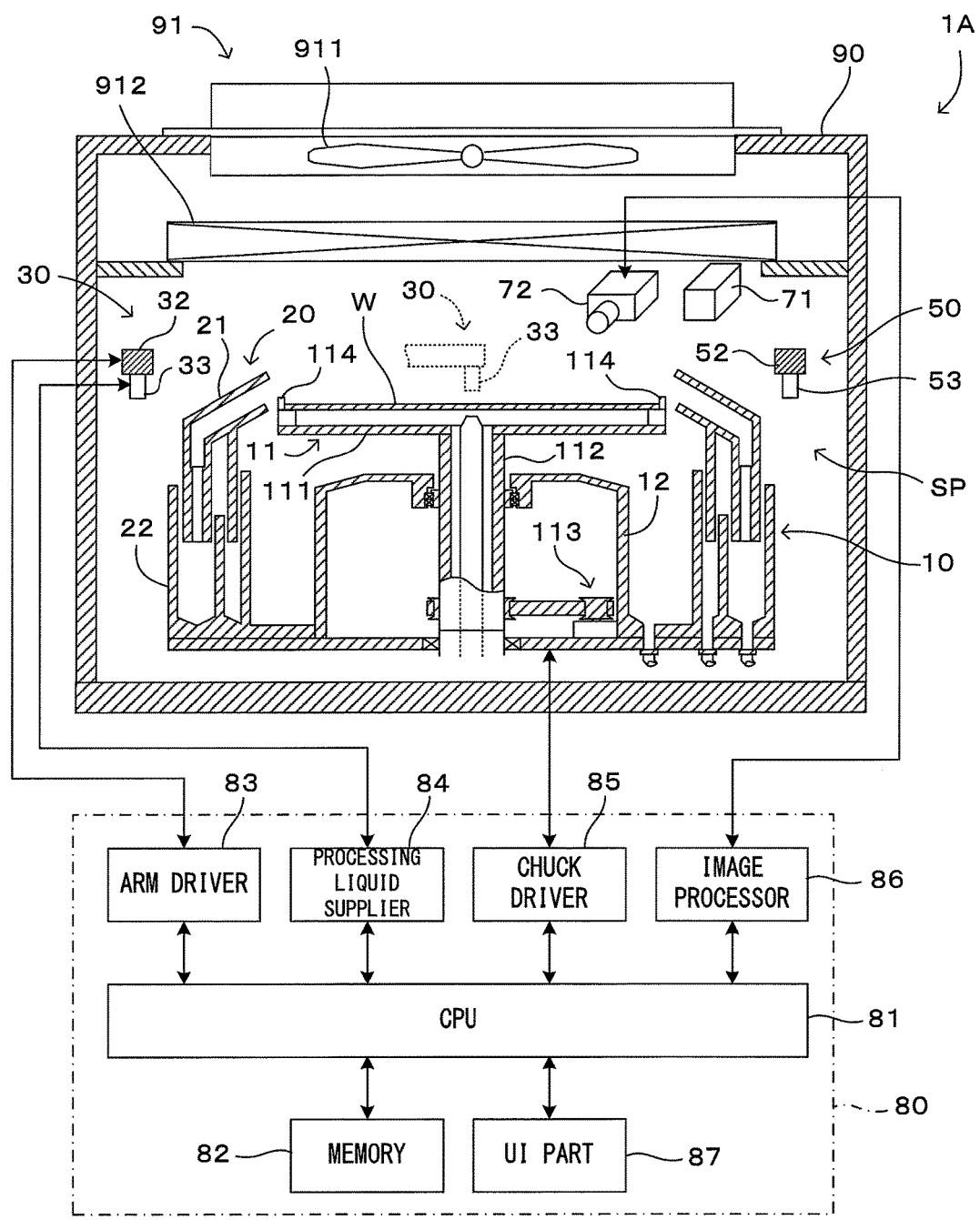

F I G. 8
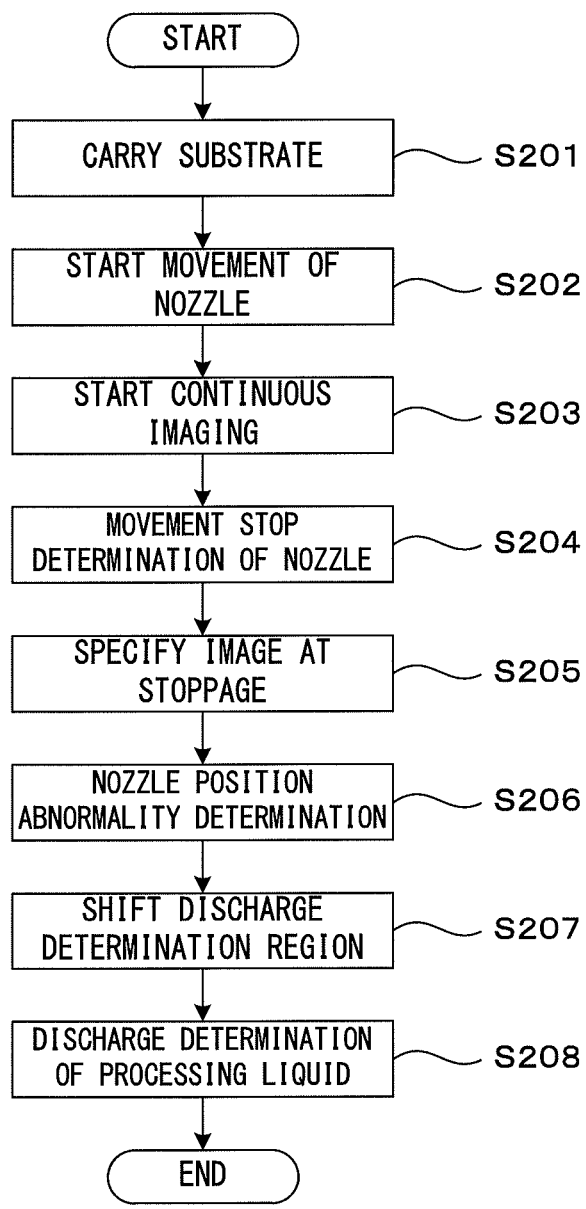

LUMINANCE SUMMATION VALUE
INTEGRATED IN Y DIRECTION  $S(i) = \sum_{j=0}^{y} Pij$ // FLOW-DOWN DETERMINATION METHOD, FLOW-DOWN DETERMINATION APPARATUS AND DISCHARGE APPARATUS

CROSS REFERENCE TO RELATED APPLICATION

The disclosure of Japanese Patent Application No. 2015-149633 filed on Jul. 29, 2015 including specification, drawings and claims is incorporated herein by reference in its entirety.

BACKGROUND OF THE INVENTION

1. Field of the Invention

This invention relates to a technique for determining a flow-down state of liquid flowing down from a nozzle located above a work toward the upper surface of the work.

2. Description of the Related Art

In a technique in which processing is performed by supplying liquid to a processing object (work) such as a substrate, it is necessary in some cases to monitor whether or not a predetermined amount of the liquid is supplied at a predetermined timing. A technique for determining a discharged state of liquid discharged from a nozzle is, for example, described in each literature below.

In a technique described in JP2002-316080A, a discharge port of a nozzle is imaged by a camera. Further, a background plate is provided at a position equivalent to the background of the nozzle when viewed from the camera and a moment of starting the discharge is detected by a change in shading appearing in an image. Further, a technique described in JP2009-095826A is a technique for inspecting a nozzle, and optically detects a thickness of a liquid column discharged in a column-like manner from the nozzle. Specifically, reflected light of light irradiated toward the liquid column is imaged, a discharge amount (thickness of the liquid column) is determined from a luminance average value of an image and the presence or absence of a variation of the discharge amount is determined from a luminance variation amount. Further, in a technique described in JP2012-009812A, a liquid column which becomes luminous by the reflection of illumination light by the liquid column is imaged. The presence or absence of the discharge, a discharge amount and the like are determined by comparing that image and reference information prepared in advance.

In each of the above conventional techniques, the discharge is determined utilizing a change of the content of an image to be imaged depending on the presence or absence of the discharge. However, since the processing is required to be even faster, it has been difficult to utilize such determination techniques. For example, in a configuration in which the discharge of liquid is started after a movable nozzle is positioned at a predetermined position, the start of the discharge of the liquid can be detected by detecting a change between a reference image after the positioning of the nozzle and before the discharge of the liquid and an image after the start of the discharge. In contrast, it has also become necessary in recent years to discharge liquid substantially during a movement of a nozzle or simultaneously with the completion of positioning. In such a configuration, it is difficult to prepare a reference image to be compared. Further, a liquid discharge time has also become shorter for faster processing and the saving of processing liquid.

Thus, a technique is required which can reliably determine a state of liquid from an image imaged at a certain time without depending on a comparison with an image before or after the former image or a reference image.

SUMMARY OF THE INVENTION

This invention was developed in view of the above problem and aims to provide a technique capable of reliably determining a flow-down state of liquid flowing down from a nozzle located above a work toward the upper surface of the work based on an imaged image.

One aspect of this invention is directed to a flow-down determination method for determining a flow-down state of liquid from a nozzle, the flow-down determination method comprising: performing imaging such that a flow-down path of the liquid from the nozzle arranged above a work to an upper surface of the work is included in an imaging field of view; calculating a total value of pixel values of pixels belonging to each pixel column composed of the pixels arranged in a line along a flow-down direction of the liquid in an evaluation region corresponding to the flow-down path out of an imaged image; and determining presence or absence of the flow-down of the liquid based on a change mode of the total value in an orthogonal direction orthogonal to the flow-down direction.

Further, another aspect of this invention is directed to a flow-down determination apparatus for determining a flow-down state of liquid from a nozzle, the flow-down determination apparatus comprising: an imager which performs imaging such that a flow-down path of the liquid from the nozzle arranged above a work to an upper surface of the work is included in an imaging field of view, a calculator which calculates a total value of pixel values of pixels belonging to each pixel column composed of the pixels arranged in a line along a flow-down direction of the liquid in a region corresponding to the flow-down path out of an imaged image, and a determiner which determines presence or absence of the flow-down of the liquid based on a change mode of the total value in an orthogonal direction orthogonal to the flow-down direction.

In these configurations, the pixel values of the pixels arranged along the flow-down direction of the liquid are totaled in the region (evaluation region) corresponding to the flow-down path of the liquid out of the imaged image. If the liquid in the image has a specific luminance different from that of background, the liquid can be optically detected from the image. At this time, by cumulatively adding the pixel values of the pixels arranged along the flow-down direction of the liquid, the influence of an object to be imaged randomly present in the flow-down direction is reduced. On the other hand, if the liquid flows along the flow-down direction, the luminance specific to the liquid is added to emphasize a difference from the background part. By detecting such a difference, the flow-down state of the liquid can be determined.

Specifically, the flow-down state of the liquid can be determined depending on which change mode is indicated in the orthogonal direction orthogonal to the flow-down direction by the total value of the pixel values obtained for each pixel column along the flow-down direction. For example, if the liquid is not present at all, an image of the part corresponding to the flow-down path is not different from an image of the background and no significant variation of the total value appears in the orthogonal direction. In contrast, for example, if the liquid continuously flows down in a column-like manner from the nozzle, a large difference appears between the total value of the part taken up by the liquid column and the total value of a part other than the former part in the orthogonal direction.

As just described, a characteristic change of the image associated with the flow-down of the liquid notably appears along the flow-down direction of the liquid. In light of such a property, a characteristic appearing in association with the flow-down of the liquid is emphasized in the invention by totaling the pixel values in the pixel column along the flow-down direction. Then, by evaluating a change of the total value in the direction orthogonal to the orthogonal direction, the presence or absence of the liquid can be precisely determined in the invention.

As described above, the change mode of the total value of the pixel values of the pixels arranged along the flow-down direction of the liquid in the orthogonal direction in the image is focused in the invention. By doing so, in the invention, the flow-down state of the liquid can be reliably determined even without using a reference image or an image imaged before or after the former image.

Still another aspect of the invention is directed to a discharge apparatus, the discharge apparatus comprising: a holder which holds a work; a nozzle which discharges liquid from above the work; an imager which performs imaging such that a flow-down path of the liquid from the nozzle arranged above the work to an upper surface of the work is included in an imaging field of view; a calculator which calculates a total value of pixel values of pixels belonging to each pixel column composed of the pixels arranged in a line along a flow-down direction of the liquid in a region corresponding to the flow-down path out of an imaged image, and a determiner which determines presence or absence of the flow-down of the liquid based on a change mode of the total value in an orthogonal direction orthogonal to the flow-down direction. In such a configuration, a flow-down state of the liquid discharged from the nozzle toward the work can be determined by the principle described above. Thus, whether or not the liquid is properly discharged can be determined.

As described above, according to the invention, the pixel values are totaled in the column of the pixels along the flow-down direction of the liquid and a determination based on a change mode of the total value in the orthogonal direction orthogonal to the flow-down direction is executed. By doing so, the flow-down state of the liquid can be reliably determined from an imaged image.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

BRIEF DESCRIPTION OF THE DRAWINGS

FIG. 3 is a drawing which shows the cross section of FIG. 2 taken along the arrow A-A and shows the structure of the controller of the substrate processing unit.

FIG. 8 is a flow chart showing the determination processings of the substrate processing unit.

DETAILED DESCRIPTION OF THE PREFERRED EMBODIMENTS

A substrate processing system comprising a substrate processing apparatus to which the invention is applicable will now be briefly described. In the following, a substrate may be any one of various types of substrates such as a semiconductor substrate, a glass substrate for photo mask, a glass substrate for liquid crystal display, a glass substrate for plasma display, a substrate for FED (Field Emission Display), an optical disk substrate, a magnetic disk substrate and a magneto-optic disk substrate. While the following will describe as an example a substrate processing system used primarily for processing of a semiconductor substrate with reference to drawings, the invention is applicable to processing of various types of substrates mentioned above.

Figure 1:
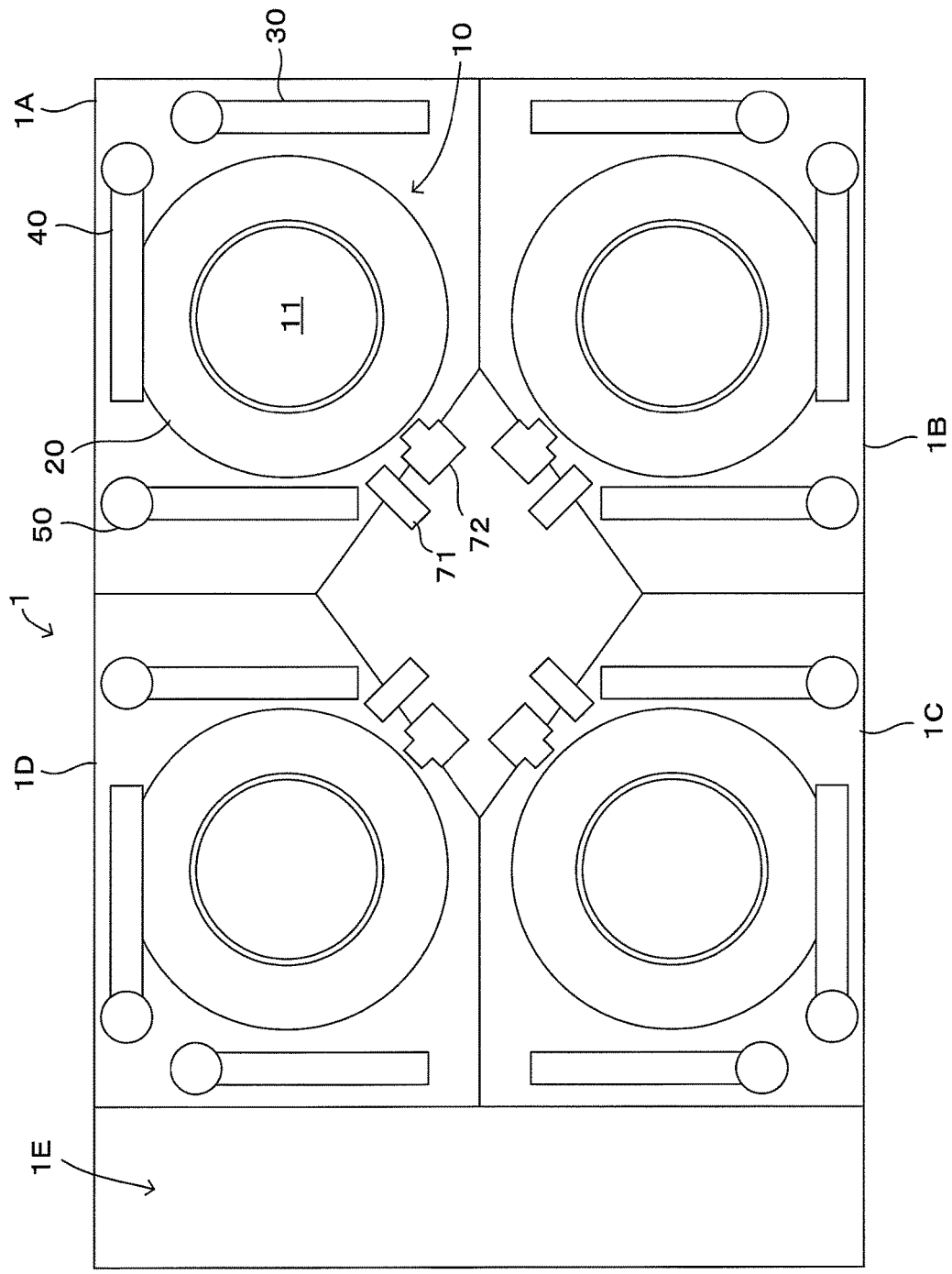
FIG. 1 is a schematic drawing which shows the structure of a substrate processing system according to an embodiment of the invention.

FIG. 1 is a schematic drawing which shows the structure of a substrate processing system according to an embodiment of the invention. To be more specific, FIG. 1 is a plan view which shows an embodiment of a substrate processing system comprising a discharge apparatus to which the invention is applied in a preferable fashion. The substrate processing system 1 comprises substrate processing units 1A, 1B, 1C and 1D, an indexer part 1E and a controller 80 (FIG. 3). The substrate processing units 1A, 1B, 1C and 1D are capable of executing predetermined processing of a substrate independently of each other. The indexer part 1E is equipped with an indexer robot (not shown) which is for transferring the substrate from the substrate processing units 1A, 1B, 1C and 1D to outside and vice versa. The controller 80 controls operations of the entire system. Any number of substrate processing units may be disposed, and more than one layers each housing four substrate processing units which are arranged horizontally may be stacked one atop the other.

The substrate processing units 1A, 1B, 1C and 1D are identical to each other with respect to structural elements and operations, although the layout of the structural elements is partially different depending upon the locations of these units within the substrate processing system 1. The following will describe the structure and operations of the substrate processing unit 1A but will omit describing the other substrate processing units 1B, 1C and 1D in detail.

Figure 2:
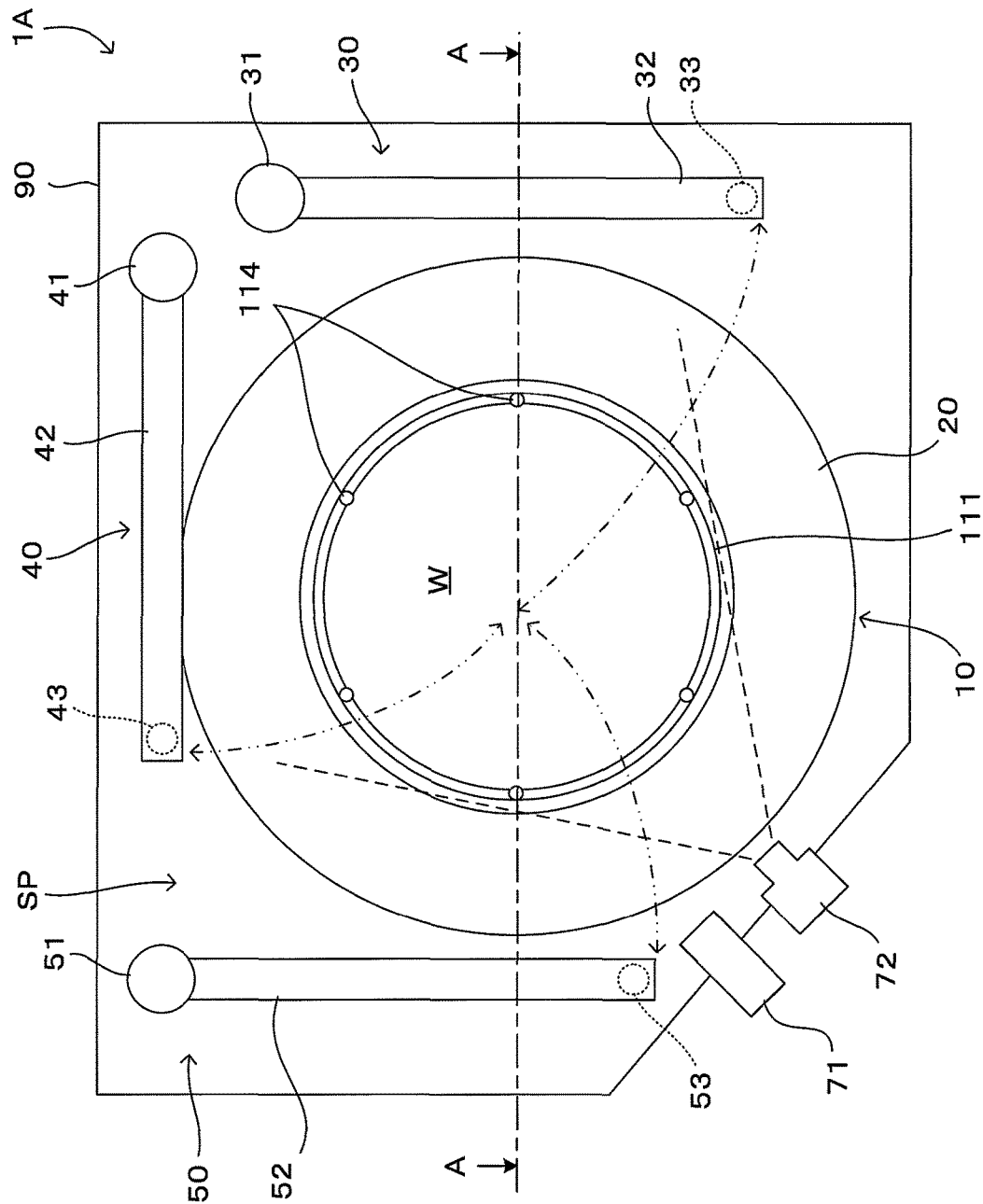
FIG. 2 is a plan view which shows the structure of one substrate processing unit.

FIG. 2 is a plan view which shows the structure of one substrate processing unit. FIG. 3 is a drawing which shows the cross section of FIG. 2 taken along the arrow A-A and shows the structure of the controller of the substrate processing unit. The substrate processing unit 1A is a wet processing unit of the single wafer processing type for executing wet processing, such as cleaning and etching using a processing liquid, of a disk-shaped substrate W such as a semiconductor wafer. In the substrate processing unit 1A, a fan filter unit (FFU) 91 is disposed to a ceiling section of a chamber 90. The fan filter unit 91 comprises a fan 911 and a filter 912. External atmosphere which is admitted as the fan 911 operates is supplied into a processing space SP which is inside the chamber 90 via the filter 912. The substrate processing system 1 is used as it is installed inside a clean room, and the processing space SP continuously receives clean air all times.

A substrate holder 10 is disposed inside the processing space SP of the chamber 90. The substrate holder 10 is for rotating the substrate W while maintaining the substrate W in an approximate horizontal posture so that the one surface of the substrate W is directed toward above. The substrate holder 10 comprises a spin chuck 11 in which a disk-shaped spin base 111 whose outer diameter is slightly larger than the substrate W and a rotation support shaft 112 which elongates approximately along the vertical direction are integrated and linked with each other. The rotation support shaft 112 is linked with the rotation shaft of a chuck rotating mechanism 113 which includes a motor so that it is possible for the spin chuck 11 to rotate about the rotation shaft (the vertical axis) when driven by a chuck driver 85 of the controller 80. The rotation support shaft 112 and the chuck rotating mechanism 113 are housed inside a cylindrical casing 12. The spin base 111 is integrated and linked with the top end of the rotation support shaft 112 by a fastening component such as a screw, and the spin base 111 is supported by the rotation support shaft 112 approximately horizontally. Hence, as the chuck rotating mechanism 113 operates, the spin base 111 rotates about the vertical axis. The controller 80 controls the chuck rotating mechanism 113 via a chuck driver 85, which makes it possible to adjust the rotation speed of the spin base 111.

There are a plurality of chuck pins 114 for grabbing the substrate W at the peripheral edge which are disposed in the vicinity of the peripheral edge of the spin base 111. There may be three or more (six in this example) such chuck pins 114 for the purpose of securely holding the circular substrate W. The chuck pins are disposed at equal angular intervals along the peripheral edge of the spin base 111. Each chuck pin 114 is structured so as to be able to switch between the pressing state in which it presses the exterior peripheral edge surface of the substrate W and the released state in which it is off the exterior peripheral edge surface of the substrate W.

Each one of the chuck pins 114 is released when the substrate W is handed over to the spin base 111 but remains in the pressing state when the substrate W is rotated and subjected to predetermined processing. When in the pressing state, the chuck pins 114 can hold the substrate W at the peripheral edge of the substrate and keep the substrate W approximately horizontally over a predetermined gap from the spin base 111. Thus, the substrate W is supported with its top surface directed toward above and its bottom surface directed toward below. The chuck pins 114 may be of a known structure such as that disclosed in JP2013-206983A for instance. The mechanism for holding substrates is not limited to chuck pins but may instead be a vacuum chuck which sucks the substrate W at the back surface of the substrate and thereby holds the substrate.

Around the casing 12, a splash guard 20 is disposed which surrounds the substrate W which is held horizontally by the spin chuck 11 in such a manner that the splash guard 20 can move upward and downward along the rotation shaft of the spin chuck 11. The splash guard 20 has an approximately rotation symmetric shape with respect to the rotation shaft, and comprises a plurality of guards 21 (two guards in this example), which are each disposed concentric to the spin chuck 11 and receive a splashed processing liquid from the substrate W, and a liquid receiver 22 which receives the processing liquid flowing down from the guards 21. As a guard up-down mechanism not shown disposed to the controller 80 makes the guards 21 ascend or descend stepwise, it is possible to segregate and collect a processing liquid such as a chemical solution and a rinse solution splashed around from the rotating substrate W.

Around the splash guard 20, at least one liquid supplier is disposed which provides the substrate W with various types of processing liquids such as a chemical solution which may be an etching solution, a rinse solution, a solvent, pure water and DIW (deionized water). In this example, as shown in FIG. 2, there are three liquid dischargers 30, 40 and 50. The liquid discharger 30 comprises a revolving shaft 31, which can revolve about the vertical axis when driven by an arm driver 83 of the controller 80, an arm 32 extending horizontally from the revolving shaft 31, and a nozzle 33 which is attached as it is directed toward below to the tip end of the arm 32. As the arm driver 83 drives the revolving shaft 31, the arm 32 swings about the vertical axis, whereby the nozzle 33 reciprocally moves between a retracted position which is outward beyond the splash guard 20 (i.e., the position denoted by the solid line in FIG. 3) and a position above the center of rotation of the substrate W (i.e., the position denoted by the dotted line in FIG. 3) as shown by the two-dot chain line in FIG. 2. The nozzle 33, while staying above the substrate W, discharges a predetermined processing liquid supplied from a processing liquid supplier 84 of the controller 80 and accordingly supplies the processing liquid to the substrate W.

Similarly, the processing liquid discharger 40 comprises a revolving shaft 41 which is driven by the arm driver 83, an arm 42 linked with this revolving shaft 41, and a nozzle 43 which is attached to the tip end of the arm 42 and discharges the processing liquid fed from the processing liquid supplier 84. The processing liquid discharger 50 comprises a revolving shaft 51 which is driven by the arm driver 83, an arm 52 linked with this revolving shaft 51, and a nozzle 53 which is attached to the tip end of the arm 52 and discharges the processing liquid fed from the processing liquid supplier 84. The number of the processing liquid dischargers is not limited to this but may be increased or decreased as needed.

In a condition that the substrate W is rotating at a predetermined rotation speed as the spin chuck 11 rotates, the processing liquid dischargers 30, 40 and 50 supply the processing liquid to the substrate W while the nozzles 33, 43 and 53 become positioned above the substrate W one after another, thereby performing wet processing of the substrate W. Different processing liquids or the same processing liquid may be discharged at the nozzles 33, 43 and 53 in accordance with the purpose of processing. Alternatively, two or more types of processing liquids may be discharged from one nozzle. The processing liquid supplied to the vicinity of the center of rotation of the substrate W spreads outwardly due to centrifugal force which develops as the substrate W rotates, and eventually gets drained off toward the side from the peripheral edge of the substrate W. The processing liquid thus splashed by the substrate W is then received by the guards 21 of the splash guard 20 and collected by the liquid receiver 22.

The substrate processing apparatus 1A further comprises an illuminator 71 which illuminates inside the processing space SP and a camera 72 which is neighboring of the illuminator 71 and takes an image of the surface of inside the processing space SP. The illuminator 71 and the camera 72 are arranged horizontally side by side in FIG.2. Instead of this, these may be arranged vertically, that is, the illuminator 71 may be disposed at above or below the camera 72. The illuminator 71 uses an LED lamp as a light source for instance, and provides illumination light into inside the interior of the processing space SP which is needed for taking an image with the camera 72. The camera 72 is disposed at a higher position as compared with the substrate W along the vertical direction, and its imaging direction (i.e., the direction of the optical axis of the imaging optical system) is set as a downwardly oblique direction toward the approximate center of rotation in the surface of the substrate W so as to take an image of the top surface of the substrate W. The entire surface of the substrate W held by the spin chuck 11 thus comes into inside the field of view of the camera 72. In horizontally, an area between the two dashed lines in FIG.2 is included in the field of view of the camera 72.

The imaging direction of the camera 72 and a direction of a light center of illumination light irradiated from the illuminator 71 substantially match. Thus, when the nozzle 33, 43, 53 and the processing liquid discharged therefrom are illuminated by the illuminator 71, the camera 72 images parts of the nozzle and the processing liquid on which the light from the illuminator 72 directly falls. This enables a high-luminance image to be obtained. At this time, the illuminator 71 and the camera 72 are provided at positions looking down the nozzle from a slightly upper side. Therefore, the occurrence of halation caused by incidence of regularly reflected light from the processing liquid into the camera 72 can be avoided. Note that since halation is not problematic for the purpose of merely determining the presence or absence of the flow-down of the processing liquid, the regularly reflected light from the processing liquid may be incident on the camera 72. Further, the illuminator 71 is arranged at any arbitrary position as long as contrast capable of discriminating the processing liquid against the background can be obtained.

The illuminator 71 and the camera 72 may be disposed inside the chamber 90, or they may be disposed outside the chamber 90 so as to illuminate or take an image of the substrate W via a transparent window of the chamber 90. In view of avoiding adhesion of the processing liquid, it is preferable that the illuminator 71 and the camera 72 are disposed outside the chamber 90.

Image data output from the camera 72 are fed to an image processor 86 of the controller 80. The image processor 86 then performs predetermined image processing of the image data such as a correction processing or a pattern matching processing described later. As described later in detail, in this embodiment, in accordance with images taken by the camera 72, how the nozzles 33, 43 and 53 are positioned and how the substrate W is held is determined.

In addition to the above, the controller 80 of the substrate processing system 1 comprises a CPU 81, a memory 82 and a user interface (UI) part 87. The CPU 81 executes a processing program set in advance and accordingly controls operations of the respective parts. The memory 82 stores the processing program executed by the CPU 81, data created during processing, etc. The UI part 87 has an input function of accepting the instruction input from a user and an output function of informing the user about a progress in processing, an occurrence of abnormality or the like as needed. Each one of the substrate processing units 1A through 1D may have one such controller 80, or only one controller 80 may be disposed for the substrate processing system 1 for control of all substrate processing units 1A through 1D. Further, the CPU 81 may function as an image processor as well.

The operation of the substrate processing unit 1A having the structure above will now be described. The other substrate processing units 1B through 1D operate similarly although they will not be described. Through the indexer part 1E, the substrate processing unit 1A receives the substrate W which has been transported from outside and supplies various types of processing liquids while rotating the substrate W, thereby executing wet processing. A number of known techniques are available which use various types of processing liquids for wet processing, and any such technique may be used.

Figure 4:
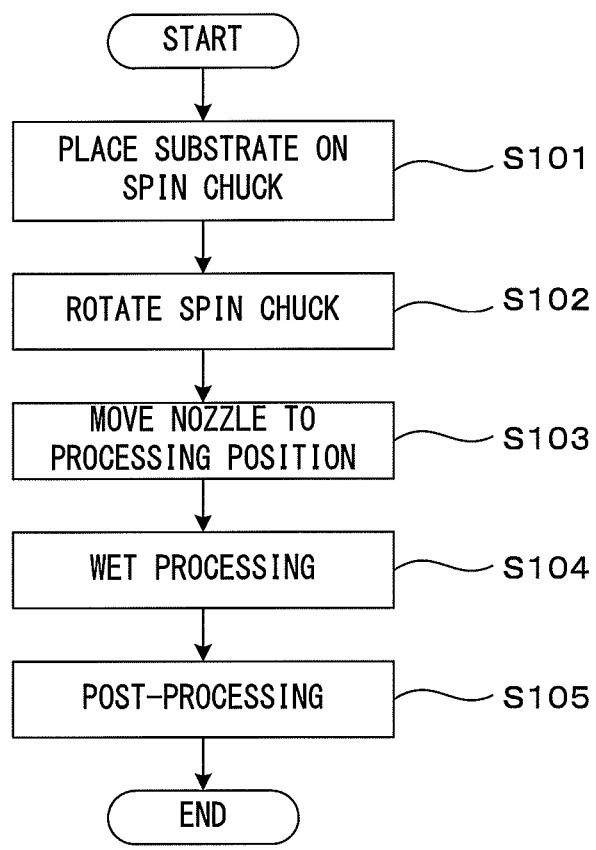
FIG. 4 is a flow chart outlining the operation of the substrate processing unit.

FIG. 4 is a flow chart outlining the operation of the substrate processing unit. When being carried into the substrate processing unit 1A, the substrate W is placed on the spin chuck 11, more specifically on the plurality of chuck pins 114 provided on the peripheral edge part of the spin base 111 (Step S101). When the substrate W is carried into, the chuck pins 114 provided on the spin base 111 are in the released state. After the substrate W is placed, the chuck pins 114 are switched to the pressing state and the substrate W is held by the chuck pins 114.

Subsequently, the spin chuck 11 is rotated at a predetermined rotation speed for substrate processing (Step S102). Then, the arm driver 83 is actuated to position any one of the plurality of nozzles at the predetermined processing position facing the substrate W (Step S103). Although the processing using the nozzle 43 is described below, the operation is similar also in the case of using the other nozzles 33, 53. Further, a plurality of nozzles may be simultaneously used for the processing.

When the nozzle 43 reaches the processing position, e.g. a position above the center of rotation of the substrate W, the wet processing is performed (Step S104). Specifically, the processing liquid is discharged from the nozzle 43 positioned at the processing position. After flowing down toward the upper surface of the substrate W rotating at the predetermined speed and landing on the vicinity of the center of rotation of the upper surface of the substrate W, the processing liquid spreads radially outwardly of the substrate W due to centrifugal force to cover the upper surface of the substrate W. In this way, the entire upper surface of the substrate W is processed by the processing liquid.

When the processing liquid is supplied for a predetermined time and the wet processing is finished, post-processing is performed (Step S105). Specifically, the nozzle 43 that has stopped discharging the processing liquid moves to the retracted position and the rotation of the spin chuck 11 is stopped. Note that the wet processing using another nozzle and processing of spinning off the processing liquid remaining on the substrate W may be performed as the post-processing with the rotation of the spin chuck 11 kept.

In the wet processing, it is necessary to properly position the nozzle at the processing position and supply the processing liquid to the substrate W at a proper timing to stably obtain a satisfactory processing result. To enable this, in the substrate processing unit 1A, the position of the nozzle and the flow-down state of the processing liquid discharged from the nozzle near the processing position are determined based on the image imaged by the camera 72. The principles of determination processings performed for this purpose and specific processing contents are successively described below.

Figure 5:
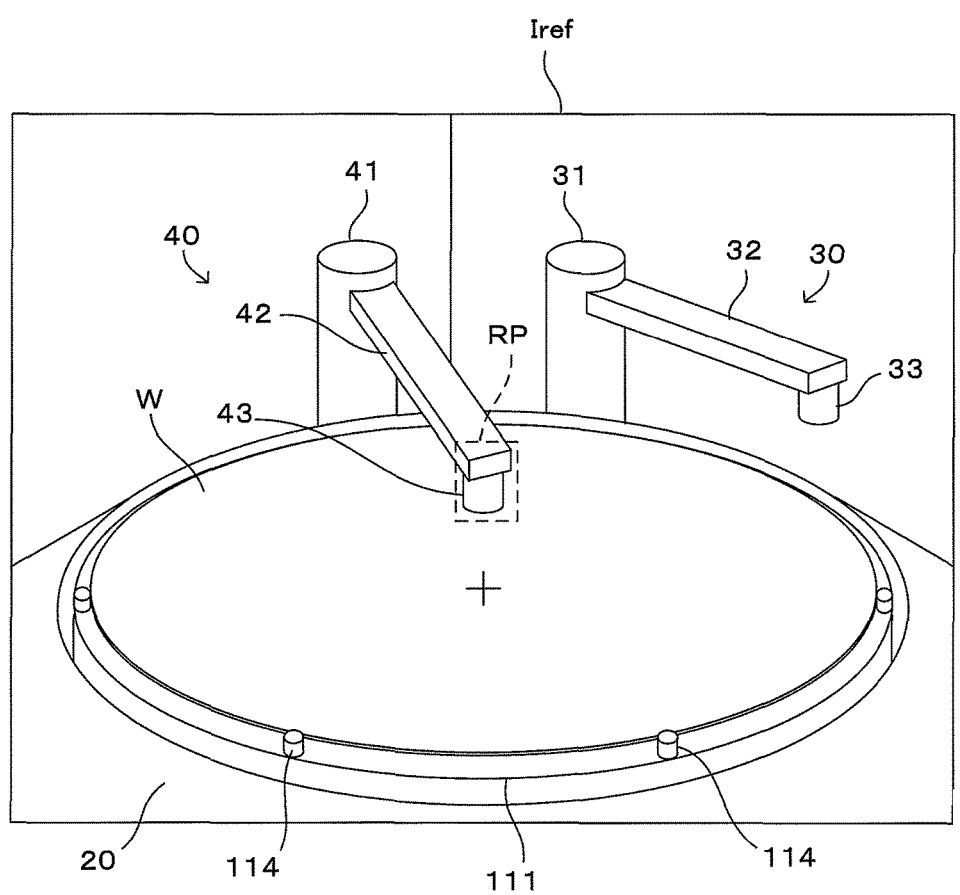
FIG. 5 is a diagram showing the principle of nozzle position determination processing.

FIG. 5 is a diagram showing the principle of nozzle position determination processing. More specifically, FIG. 5 shows an example of a reference image Iref imaged with the nozzle 43 positioned at the proper processing position, e.g. at such a position that a center of an opening of the nozzle 43 is located right above the center of rotation of the substrate W. An image of the nozzle 43 at this time is segmented as a reference pattern RP and the coordinate position thereof is stored.

When the processing on the substrate W is performed, a positioning control of the nozzle 43 is executed using the position of the nozzle 43 in the reference image Iref as a target position. When the positioning of the nozzle 43 is completed, a region of an image at that time substantially matching the reference pattern RP is searched by pattern matching processing, whereby the position of the nozzle 43 is detected. The position of the nozzle 43 at this time is compared with the position of the nozzle 43 in the reference image Iref. If a position deviation amount between the images is not larger than a threshold value determined in advance, the position of the nozzle 43 is determined to be proper. On the other hand, if the deviation amount is larger than the threshold value, the nozzle position is determined to be abnormal.

Figure 6:
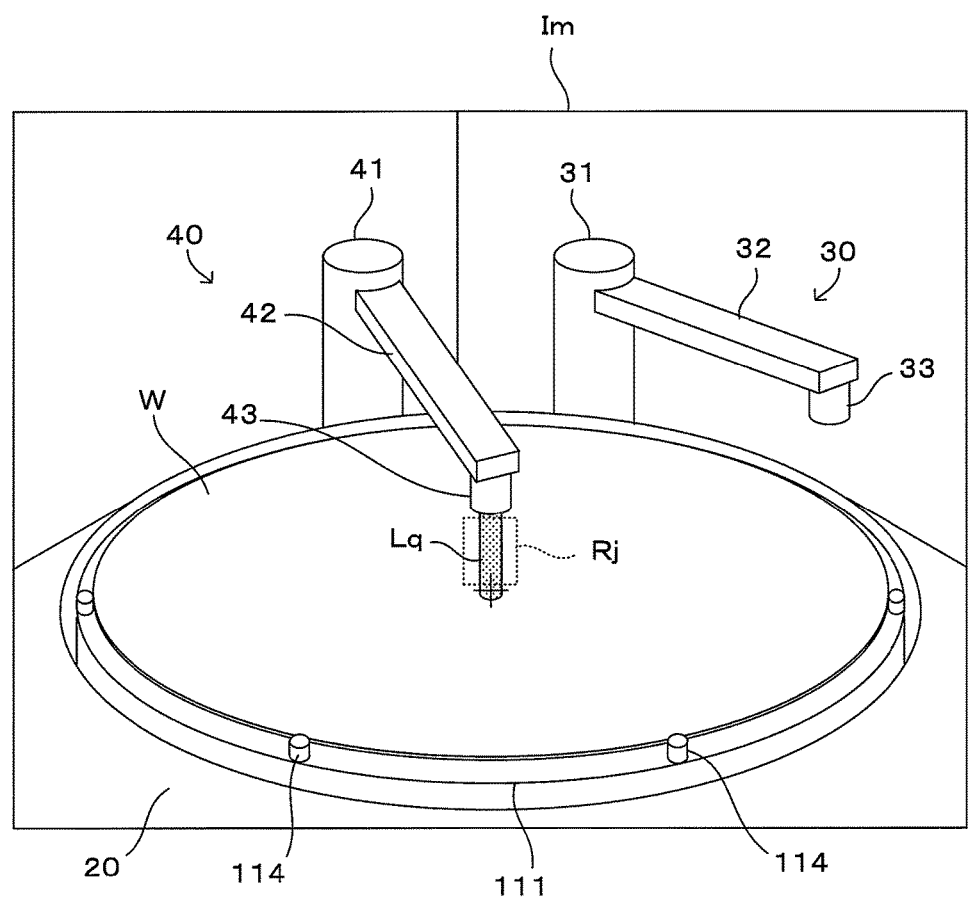
FIG. 6 is a diagram showing the principle of discharge determination processing.

FIG. 6 is a diagram showing the principle of discharge determination processing. More specifically, FIG. 6 shows an example of an image Im imaged when the processing liquid is being continuously discharged from the nozzle 43 positioned at the processing position. A partial region of the image Im including a position right below the nozzle 43, more specifically a position serving as a flow-down path for the processing liquid Lq discharged from the nozzle 43 and flowing down toward the upper surface of the substrate W is set as a discharge determination region Rj. As described later, whether or not the processing liquid Lq is being discharged from the nozzle 43 is determined based on the image content of this discharge determination region Rj.

Note that although the reference pattern RP and the discharge determination region Rj have rectangular shapes here, there is no limitation to this. If these have rectangular shapes, the positions thereof can be simply expressed such as by the positions of two vertices on a diagonal or by a combination of an origin position and lengths of sides.

Figure 7:
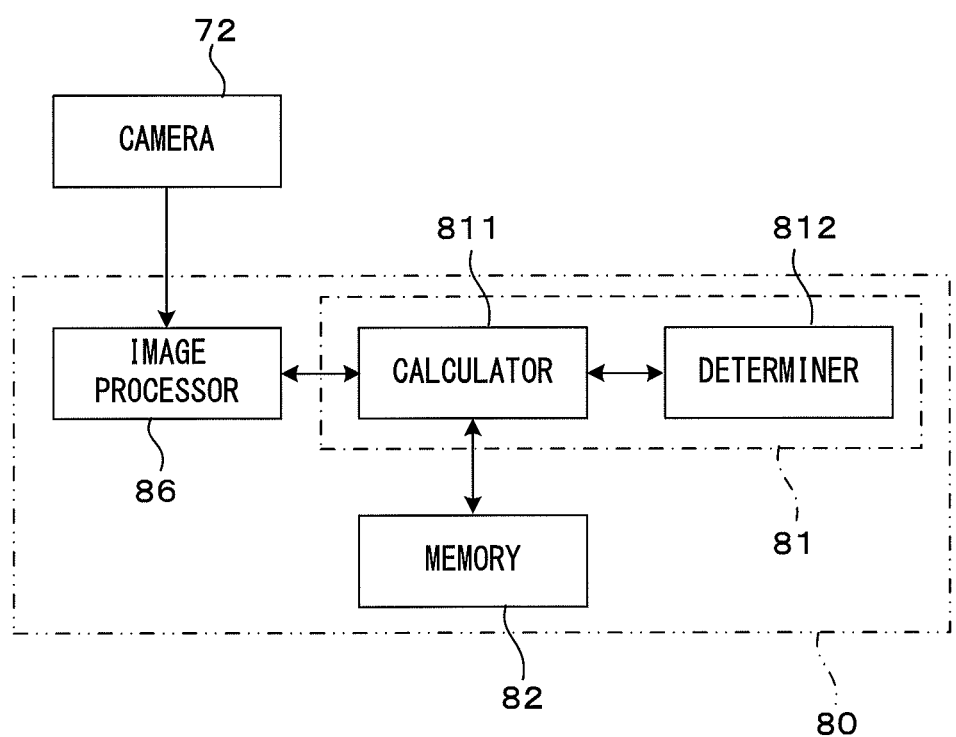
FIG. 7 is a block diagram showing functional blocks necessary to perform the determination processings.

FIG. 7 is a block diagram showing functional blocks necessary to perform the determination processings. An image processor 86 performs appropriate image processing such as noise removal processing and image analysis by pattern matching for the image imaged by the camera 72. Based on a processing result, a calculator 811 performs predetermined arithmetic processing and a determiner 812 executes a determination. Each functional block such as the calculator 811 and the determiner 812 is realized by the CPU 81 executing a predetermined control program and cooperating with the image processor 86, the memory 82 and the like.

Figure 9:
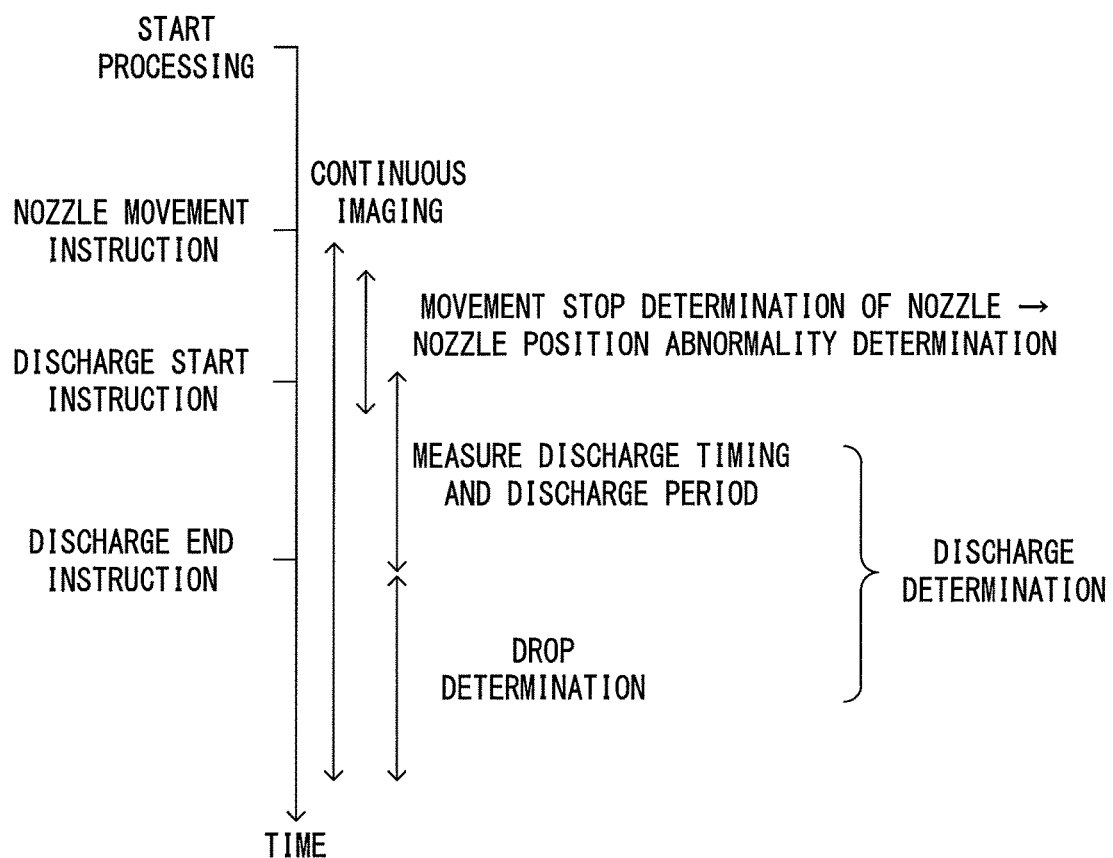
FIG. 9 is a chart showing an execution timing of each processing.

FIG. 8 is a flow chart showing the determination processings of the substrate processing unit. Further, FIG. 9 is a chart showing an execution timing of each processing. The substrate W is carried into the substrate processing unit 1A, the processing is started (Step S201) and the movement of the nozzle 43 is started (Step S202). More specifically, a nozzle movement instruction, i.e. a control command to the effect of moving the nozzle 43 from the retracted position to the processing position is given from the CPU 81 to the arm driver 83. In this way, the arm driver 83 rotates the revolving shaft 41 and the nozzle 43 moves toward the processing position.

At this time, continuous imaging by the camera 72 is started (Step S203). The camera 72 successively obtains images at a fixed time interval by regularly performing imaging at a fixed frame rate (e.g. 100 fps). The imaging by the camera 72 needs to be started before the nozzle 43 reaches the processing position. For example, the imaging may be started when an instruction to the effect of moving the nozzle is given from the CPU 81 to the arm driver 83 as shown in FIG. 9.

When the imaging by the camera 72 is started, a movement stop determination of the nozzle 43 is executed (Step S204). The nozzle movement stop determination is processing for determining whether the nozzle 43 is moving or stopped. The content of the imaged image changes frame by frame while the nozzle 43 is moving. If the nozzle 43 is stopped, there is no more change between the images. From this, for example, the calculator 811 can calculate a difference of the images between the frames adjacent with respect to imaging time and the determiner 812 can determine whether or not the nozzle 43 has been stopped, based on whether or not that difference is not larger than a fixed value. The calculation of the difference can be realized, for example, by integrating an absolute value of a difference of luminance values of pixels located at the same position in two images for all pixels. Note that a determination may be executed using images of three or more successive frames to avoid an erroneous determination due to noise or the like.

When the stop of the nozzle 43 is determined, one image imaged at a time at which the nozzle 43 seems to have stopped is specified out of a plurality of successively imaged images (Step S205). Specifically, for example, when a difference of images of two successive frames becomes equal to or smaller than the fixed value and the nozzle 43 is determined to have stopped, the image imaged earlier out of those images can be set as an image at stoppage.

A nozzle position abnormality determination is executed based on the image at stoppage (Step S206). The nozzle position abnormality determination is processing for determining whether or not the nozzle 43 is correctly positioned at the processing position determined in advance. Whether or not the nozzle position is proper can be determined by the comparison of the image at stoppage and the reference image Iref imaged with the nozzle 43 positioned at the proper position in preparatory processing performed prior to the processings on the substrate W.

Figure 10:
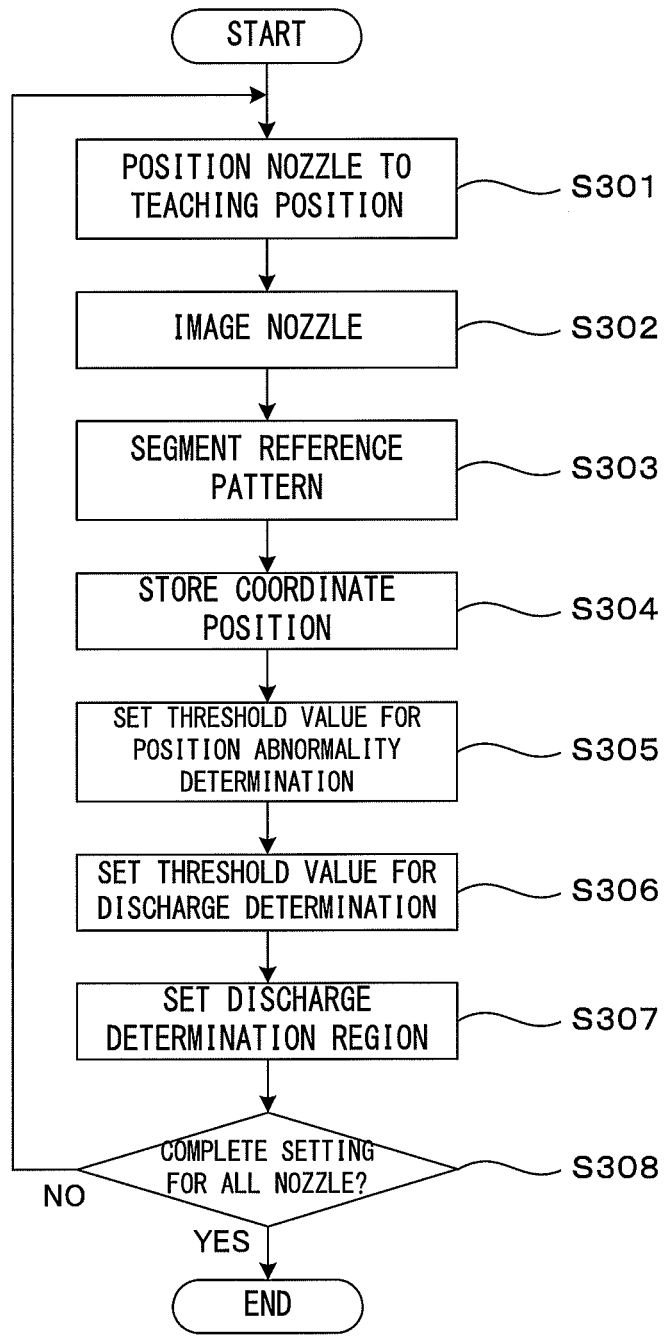
FIG. 10 is a flow chart showing the processing content of the preparatory processing.

FIG. 10 is a flow chart showing the processing content of the preparatory processing. In the preparatory processing, the position of the nozzle 43 during the substrate processing, i.e. the processing position is taught by an operator (teaching operation). The controller 80 stores the position of the nozzle 43 at that time as the proper processing position. Using this processing position as a target position during the execution of the substrate processing, the positioning control of the nozzle 43 is executed.

Specifically, the nozzle 43 is positioned at the proper processing position, e.g. the position where the center of the opening of the nozzle 43 is right above the center of rotation of the substrate W by the operation of the operator (Step S301). In this description, the position of the nozzle 43 at this time designated by the operator is called a "teaching position". Then, the camera 72 images an image including an image of the nozzle 43 in an imaging field of view (Step S302). The image at this time may be a still image of one frame. This image is used as the reference image Iref representing the proper position of the nozzle 43.

Subsequently, a partial region corresponding to the image of the nozzle 43 is segmented as the reference pattern RP from the reference image Iref (Step S303). This segmentation can be executed by extracting a rectangular region including the image of the nozzle 43 in the reference image Iref designated by the operator through an operation input to be received by the UI part 87. Further, for example, the reference pattern RP can be segmented also by the image processor 86 performing pattern matching processing and searching a region matching the image of the nozzle 43 prepared in advance in the reference image Iref. The segmented reference pattern RP is stored in the memory 82 together with the coordinate position therein in the image (Step S304).

Subsequently, a threshold value for position abnormality determination set by the operator is received by the UI part 87 (Step S305) and stored in the memory 82. The threshold value for position abnormality determination specifies a maximum deviation amount allowed between the position of the nozzle 43 in the image at stoppage and the position of the reference pattern RP in the reference image Iref. Even if the positions of the both do not perfectly match, the nozzle 43 is regarded to be positioned at the proper position if the deviation amount is not larger than the threshold value. On the other hand, if the deviation is larger than the threshold value, the nozzle position is determined to be abnormal. The determination is stricter as the threshold value becomes smaller. A numerical value of the threshold value can be appropriately set by the operator according to the purpose of the processing.

Subsequently, a threshold value for discharge determination and the discharge determination region Rj are set (Steps S306, S307). As described in detail later, in the discharge determination processing, whether or not the processing liquid Lq is being discharged from the nozzle 43 is determined based on an evaluation value calculated from a luminance value of each pixel constituting the discharge determination region Rj. A threshold value of the evaluation value for this determination is set as the threshold value for discharge determination by the operator. Further, the operator sets the discharge determination region Rj at a position corresponding to the flow-down path of the processing liquid Lq using the reference image Iref in which the nozzle 43 is positioned at the proper position. These setting inputs are received by the UI part 87 and stored in the memory 82.

By successively performing Steps S301 to S307 described above for all the nozzles (Step S308), the preparatory processing is completed. In this way, the reference pattern RP, the threshold value for position abnormality determination, the discharge determination region Rj and the threshold value for discharge determination are respectively set for each of the nozzles 33, 43 and 53.

Referring back to FIG. 8, the description of the determination processings is continued. The nozzle position abnormality determination (Step S206) is executed based on the reference pattern RP and the threshold value for position abnormality determination set in the preparatory processing, thereby whether or not the nozzle 43 is properly positioned at the processing position is determined. Specifically, the position deviation amount of the nozzle 43 in comparison to the reference image Iref is calculated by the calculator 811. If the deviation amount is not larger than the threshold value, the determiner 812 determines that the nozzle 43 is at the proper position. In this case, the processing on the substrate W is continued.

On the other hand, if the position deviation amount is determined to be larger than the threshold value, a message to the effect that the position of the nozzle 43 is abnotnial is notified to the operator via the UI part 87. In this case, the processing may be stopped as processing error or the processing may be continued after an error is recorded. Further, it may also be possible to let the operator instruct whether to continue or stop the processing.

In the case of continuing the processing, if there is any deviation between the position of the nozzle 43 and the original processing position, the discharge determination region Rj is shifted according to that deviation amount (Step S207). In this way, even if the position of the nozzle 43 is slightly deviated, the discharge determination region Rj can be properly set on the flow-down path of the processing liquid Lq. In this state, the discharge determination of the processing liquid is executed.

The discharge determination is processing for determining whether or not the processing liquid Lq is flowing down from the nozzle 43 toward the upper surface of the substrate W. More specifically, the discharge determination includes processing for measuring a discharge timing and a discharge period and liquid drop determination processing as shown in FIG. 9. As described below, a processing algorithm of the discharge determination is for determining whether or not the flow-down of the processing liquid Lq is observed in the discharge determination region Rj in the imaged image of one frame. Using this determination result, the processing for measuring the discharge timing and the discharge period and the liquid drop determination processing can be performed.

Specifically, by executing the discharge determination for each of images of a plurality of frames successively imaged, the discharge timing of the processing liquid Lq from the nozzle 43, i.e. times at which the discharge is started and stopped can be calculated. From these, the discharge period in which the discharge is continued can be calculated. Further, by detecting the flow-down of the processing liquid occurring at a timing at which the discharge is not supposed to be performed, the presence or absence of, for example, a "liquid drop phenomenon" in which the processing liquid Lq remaining in the nozzle 43 irregularly drops onto the substrate W can be determined.

The discharge determination needs to be started at the latest before the discharge is started. Thus, the discharge determination can be started, for example, when an instruction to the effect that the discharge of the processing liquid should be started is given from the CPU 81 to the processing liquid supplier 84. There is a slight time delay until the processing liquid Lq is actually discharged from the nozzle 43 after the instruction to start the discharge is given. Further, to detect a discharge end timing, the discharge determination needs to be continued for a while after an instruction to the effect that the discharge of the processing liquid should be finished is given from the CPU 81 to the processing liquid supplier 84. Further, the liquid drop determination for detecting the liquid drop phenomenon can be executed by consecutively executing the discharge determination also after the end of the discharge is detected.

Next, the processing content of the discharge determination is described. As described above, the discharge determination processing in this embodiment is processing for determining based on the image (still image) of one frame whether or not the processing liquid Lq is flowing down from the nozzle 43. Specifically, this processing does not require a reference image or an image of another frame as a comparison object. The more detailed principle and specific processing content of the discharge determination processing are successively described below.

Figure 11A:
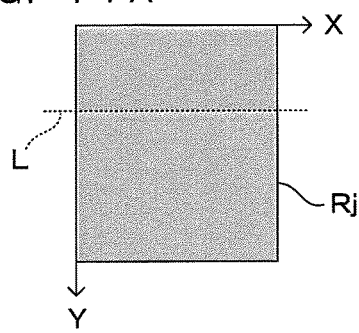
FIGS. 11A, 11B and 11C are graphs showing examples of an image content of the discharge determination region.
Figure 11A:
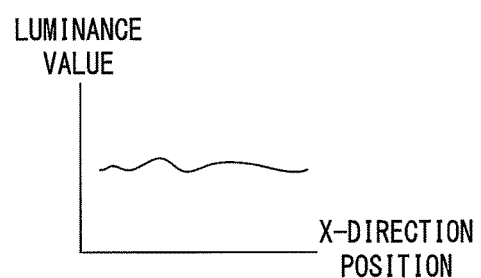
Figure 11B:
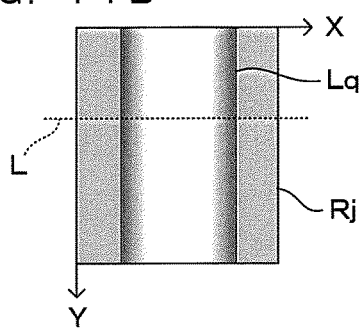
Figure 11B:
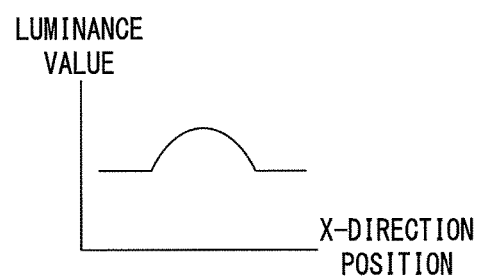
Figure 11C:
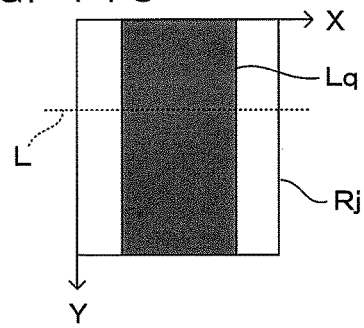
Figure 11C:
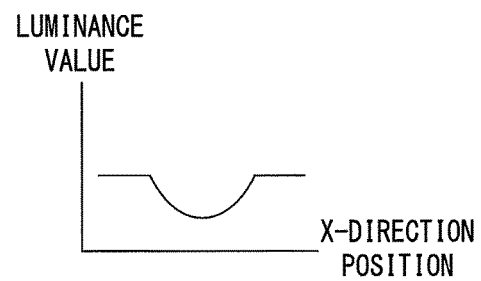

FIGS. 11A, 11B and 11C are graphs showing examples of an image content of the discharge determination region. An X direction and a Y direction in the following images are defined as follows. A two-dimensional image is expressed by arranging a number of very small pixels in a matrix in two orthogonal directions. In such a two-dimensional dimensional image, one arrangement direction is called the X direction and another arrangement direction orthogonal to the former one is called the Y direction. Here, a lateral direction is the X direction and a longitudinal direction is the Y direction with a left-upper corner of the image as an origin. As described later, it is preferable that either the X direction or the Y direction substantially matches a vertical direction in an actual imaging object. In this embodiment, the camera 72 is disposed such that the Y direction matches the vertical direction.

As can be understood from the comparison of the reference image Iref of FIG. 5 and the image Im of FIG. 6, the upper surface of the substrate W behind the flow-down path is seen at the position right below the nozzle 43 when the processing liquid is not being discharged from the nozzle 43. On the other hand, when the processing liquid is being discharged from the nozzle 43, the flow-down path is taken up by the liquid Lq at the position right below the nozzle 43 and the substrate W is masked with the liquid Lq. Thus, an image appearing in the discharge determination region Rj at an arbitrary imaging timing is either the processing liquid Lq or the upper surface of the substrate W. In other words, the arranged position of the camera 72 is desirably set to obtain such an imaging field of view.

When the processing liquid is not flowing down, only the upper surface of the substrate W appears in the discharge determination region Rj and there is no notable luminance change in the region as shown in a left figure of FIG. 11A. A right figure of FIG. 11A shows an example of a luminance distribution on a straight line L traversing the discharge determination region Rj in the X direction. As shown in this figure, the luminance distribution is relatively uniform although there is a luminance variation due to irregular reflection caused by a pattern formed on the substrate W and the reflection of components in the chamber 90.

On the other hand, if the processing liquid Lq is being continuously discharged from the nozzle 43, an image of the processing liquid Lq flowing down in a column-like manner appears in the discharge determination region Rj as shown in a left view of FIG. 11B. If illumination light is incident substantially in the same direction as the imaging direction of the camera 72, the surface of the liquid column by the processing liquid Lq looks luminous. Specifically, as shown in a right figure of FIG. 11B, a part corresponding to the liquid column has a higher luminance than a surrounding part.

If an illumination direction is different or if the processing liquid Lq has a dark color, the liquid column part may have a lower luminance than the surrounding as shown in FIG. 11C. Even in this case, a luminance distribution clearly different from that of the surrounding part is seen in a part corresponding to the liquid column. However, general processing liquid used for substrate processing is close to transparent or white and has a higher luminance than the surrounding as shown in FIG. 11B in many cases.

If the luminance characteristically appearing when the processing liquid Lq is present in the discharge determination region Rj is detected in this way, the presence or absence of the processing liquid can be determined. In the discharge determination of this embodiment, a luminance change in the discharge determination region Rj is detected by the following data processing to reliably determine the presence or absence of the flow-down of the processing liquid from the image of one frame without comparison with another image.

Figure 12A:
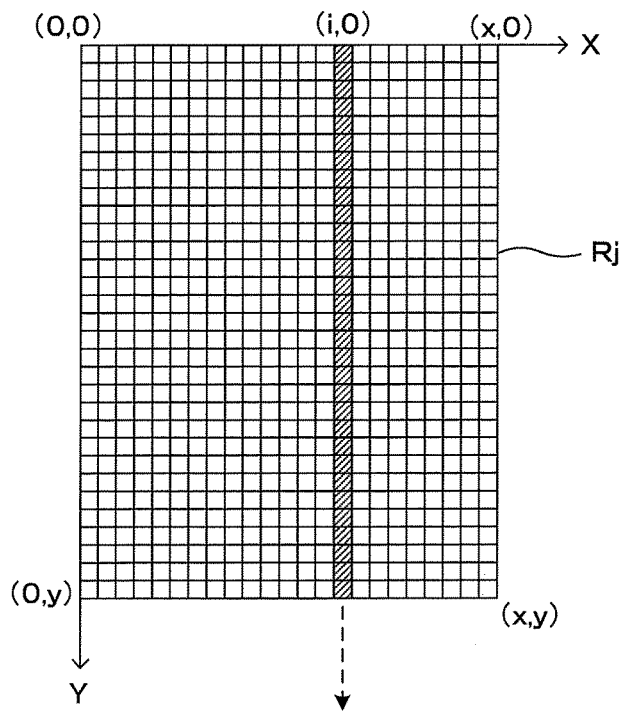
FIGS. 12A and 12B are graphs showing the data processing in the discharge determination processing.
Figure 12B:
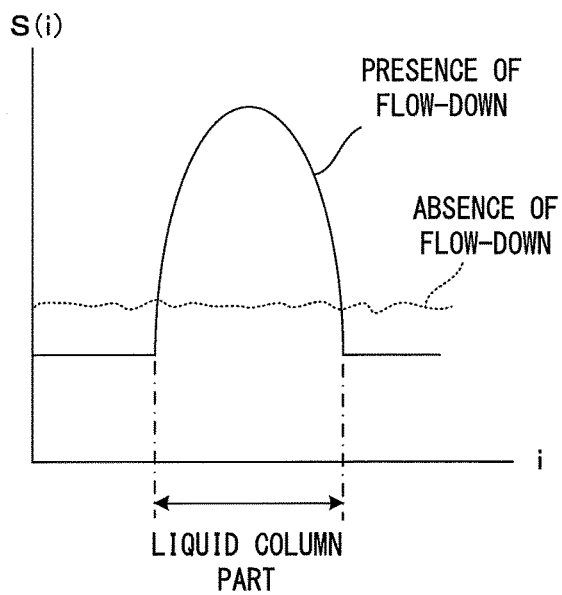

FIGS. 12A and 12B are graphs showing the data processing in the discharge determination processing. As shown in FIG. 12A, a pixel on the left-upper corner and a pixel on the right-lower corner of the discharge determination region Rj are represented by coordinates (0, 0) and (x, y). The discharge determination region Rj is composed of (x+1) pixels in the X direction and (y+1) pixels in the Y direction and the Y direction matches the vertical direction during imaging. A pixel column composed of a plurality of pixels having a common X-coordinate value and arranged in a line along the Y direction out of the pixels constituting the discharge determination region Rj is thought and luminance values of the respective pixels belonging to this pixel column are totaled. This is equivalent to the summation of the luminance values of all the pixels (pixels hatched in FIG. 12A) having an X-coordinate value of i ($0 \le i \le x$) in the Y direction. This total value is called a "luminance summation value" below. If the luminance value of the pixel at coordinates (i, j) is Pij, the luminance summation value S(i) in the pixel column having the X-coordinate value of i is expressed by the following equation (1).

[Equation 1]

$$S(i) = \sum_{j=0}^{y} Pij \quad \text{(Equation 1)}$$

Here, the Y direction matches the vertical direction, i.e. the direction in which the processing liquid Lq discharged from the nozzle 43 flows down toward the substrate W. Accordingly, when the processing liquid Lq is continuously discharged from the nozzle 43 and flows down in a column-like manner, a liquid column extending along the Y direction, i.e. the direction of the pixel column appears in the discharge determination region Rj. Thus, if this pixel column is located at a position corresponding to the interior of the liquid column, many pixels have a luminance value specific to the processing liquid Lq. On the other hand, if this pixel column is located at a position corresponding to a background part around the liquid column, the pixels have a luminance value of the substrate W in the background.

Thus, in the luminance summation value S(i) integrated in the Y direction for each pixel column, the luminance value specific to the processing liquid Lq is more emphasized if this pixel column is located at the position corresponding to the interior of the liquid column. In contrast, if this pixel column is located at the position corresponding to the background part, a change in shading along the Y direction is canceled out and the luminance summation value S(i) is a value approximate to the integration of average luminance values of the substrate W.

As shown in FIG. 12B, if a profile plotting the luminance summation value S(i) in relation to the value i, i.e. the X-direction position of the pixel column is thought, a difference of luminance profiles shown in the right figures of FIGS. 11A and 11B is more emphasized. Specifically, when the liquid column is present in the discharge determination region Rj, the luminance values of a part of the luminance profile shown in the right figure of FIG. 11B corresponding to the liquid column are more emphasized and appear as a large peak (dip if the processing liquid has a dark color) to clarify the difference from the background part as schematically shown by solid line in FIG. 12B. On the other hand, if the liquid column is not present in the discharge determination region Rj, no significant peak appears as shown by dotted line in FIG. 12B.

Accordingly, if a change mode in the X direction of the luminance summation value S(i) in the Y direction is checked in one image, the presence or absence of the flow-down of the processing liquid Lq in the discharge determination region Rj can be determined even without comparison with another image. By using the luminance summation value S(i) in the pixel column along the flow-down direction of the processing liquid Lq, a luminance change associated with the flow-down of the liquid can be more accurately detected even if the luminance change is small, which can lead to a more reliable determination.

The discharge determination region Rj needs to include a region where the luminance changes depending on the presence or absence of the processing liquid Lq, but needs not necessarily include the entire flow-down path of the processing liquid Lq. It is preferable that the liquid column by the processing liquid Lq reaches from the upper end to the lower end of the discharge determination region Rj in the Y direction as shown in FIG. 11B. In this sense, only a part of the flow-down path may be included. Further, it is preferable to include, more or less, the background part around the liquid column in the X direction. By doing so, the luminance of the liquid column part can be more effectively emphasized in comparison to the background part.

Note that, in illumination from a direction substantially matching the imaging direction, a central part of the liquid column has a particularly high luminance in the X-direction and a peripheral edge part has a luminance lower than this. Specifically, a characteristic luminance profile appears in the X-direction in the region of the discharge determination region Rj corresponding to a central part of the liquid column. Thus, the background part is not always necessary in the case of utilizing this characteristic luminance for detection. The same holds also when there is a clear difference in luminance value between the liquid column part and the background part as described later.

Note that an image of a droplet appears in a part of the flow-down path in the discharge determination region Rj if the processing liquid Lq flows down not continuously, but in droplets, for example, in the liquid drop phenomenon. Even in this case, an image of a droplet has a certain spread in the Y-direction along the flow-down direction. Thus, by totaling the luminance values in the Y-direction and emphasizing the luminance values specific to the processing liquid, it is possible to reliably grasp a difference in the luminance summation value between when the droplet is included in the pixel column and when no droplet is included, regardless of the position of the droplet. However, the magnitude of a peak appearing in the profile of the luminance summation value is expected to be smaller than in the case of the liquid column.

In a specific determination process, an appropriate evaluation value quantitatively indicating the change mode in the profile of the luminance summation value S(i) in relation to the X-direction coordinate value i, is for example, introduced and the presence or absence of the processing liquid is determined depending on a magnitude relation between the evaluation value and a threshold value determined in advance. If the processing liquid has a higher luminance than the background in the image, the following measure can be, for example, adopted.

Figure 13A:
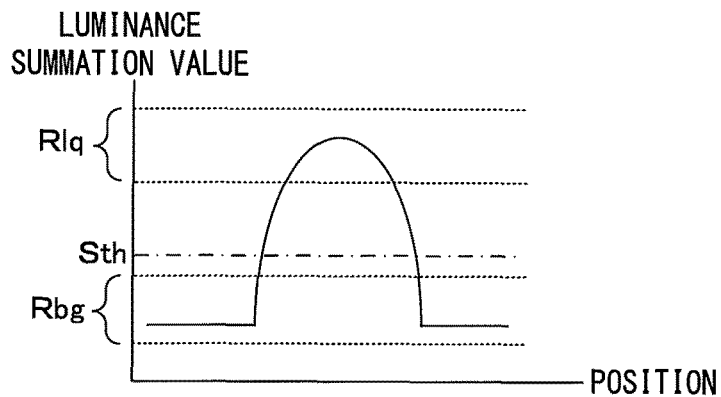
FIGS. 13A, 13B and 13C are graphs illustrating a relationship between the evaluation value and the threshold value.
Figure 13B:
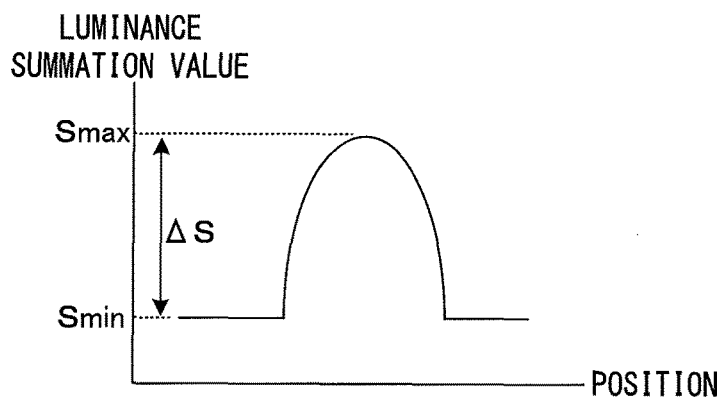
Figure 13C:
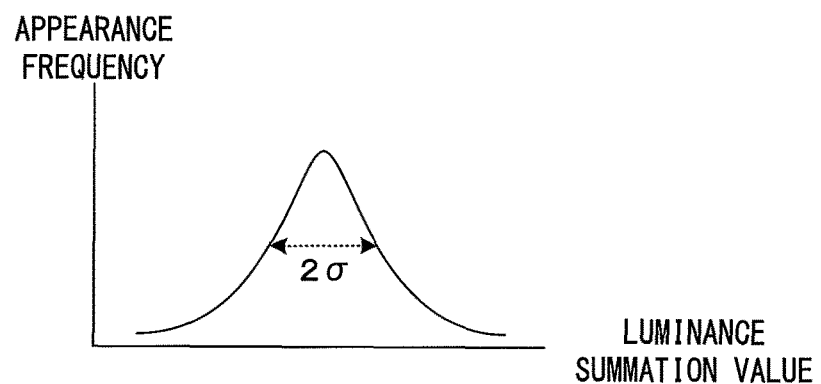

FIGS. 13A, 13B and 13C are graphs illustrating a relationship between the evaluation value and the threshold value. When a range Rlq of the luminance summation value of the processing liquid Lq and a range Rbg of the luminance value of the background part are known beforehand and these are clearly separable as shown in FIG. 13A, the luminance summation value S(i) itself can be used as the evaluation value. Specifically, a value slightly closer to a high luminance side than the range Rbg of the luminance summation value from the background may be set as a threshold value Sth. Basically, the threshold value Sth may be set at any value between the luminance summation value range Rlq of the processing liquid Lq and the luminance summation value range Rbg of the background part. However, to detect also droplets, which are not continuous, as described above, the presence of the flow-down of the processing liquid is preferably determined if the luminance summation value S(i) is larger than the luminance summation value range Rbg of the background. Thus, the threshold value Sth is set at a value close to an upper limit of the luminance summation value range Rbg of the background.

Further, as shown in FIG. 13B, a difference ΔS between a maximum value Smax and a minimum value Smin in the profile of the luminance summation value S(i) may be used as the evaluation value. If a notable peak associated with the flow-down of the processing liquid is present, this difference ΔS is a large value. On the other hand, in the absence of the flow-down of the processing liquid, this difference ΔS is a very small value. From this, the difference ΔS between the maximum value Smax and the minimum value Smin of the luminance summation value S(i) may be used as the evaluation value and a threshold value may be set for this.

Further, if positions taken by the liquid column by the processing liquid Lq and positions taken up by the background part are known in advance in the discharge determination region Rj, it is effective to compare the luminance summation values S(i) between the pixel columns located at the respective positions. For example, if the discharge determination region Rj is so set that the flow-down path is located in a central part in the X-direction, a difference between the luminance summation value of the pixel column located in the central part of the discharge determination region Rj in the X-direction and the luminance summation value of the pixel column located in a peripheral part in the X-direction can be set as the evaluation value. Further, if the pixel column on the left end of the discharge determination region Rj corresponds to the liquid column part and the pixel column on the right end corresponds to the background part, a difference between the luminance summation value S(0) of the pixel column on the left end and the luminance summation value S(x) of the pixel column on the right end can be set as the evaluation value. In these cases, a total or average value of the luminance summation values of a plurality of pixel columns proximate to each other, e.g. successive one after another may be used instead of the luminance summation value of one pixel column.

Further, as shown in FIG. 13C, a standard deviation σ when a plurality of luminance summation values S(i) obtained for the respective pixel columns constitute a population may be set as the evaluation value. As shown in FIG. 12B, a variation of the luminance summation value S(i) is relatively small if the discharge determination region Rj includes no image of the processing liquid, and the luminance summation value S(i) largely varies depending on the coordinate value i if the image of the processing liquid is included. Accordingly, the standard deviation σ among the luminance summation values S(i) of the respective pixel columns is a large value when the image of the processing liquid is included in the discharge determination region Rj and is a small value when the image of the processing liquid is not included. Thus, a value of this standard deviation σ can be an evaluation value quantitatively indicating the change mode of the luminance summation value S(i). The standard deviation σ of the luminance summation values S(i) as the population is expressed by the following equation (2). In equation (2), a symbol m denotes an average value of the luminance summation values S(i).

[Equation 2]

$$\sigma^2 = \frac{1}{x+1} \sum_{i=0}^{x} (S(i) - m)^2 \qquad \text{(Equation 2)}$$

Although the value of the standard deviation is used as the evaluation value in the discharge determination processing described next, the evaluation value is not limited to this. The preparatory processing described above may be so configured that a threshold value (threshold value for discharge determination) corresponding to the adopted evaluation value is appropriately set.

Figure 14:
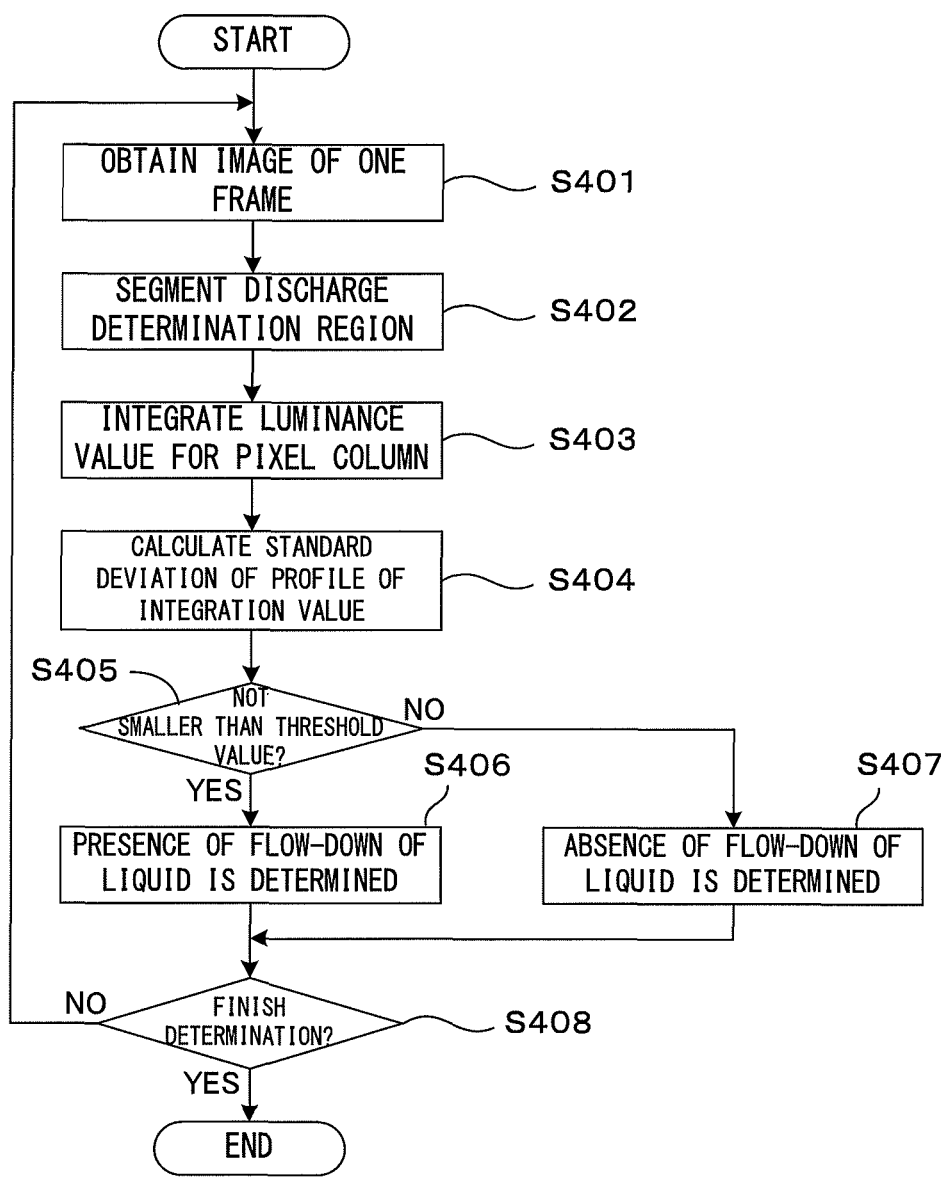
FIG. 14 is a flow chart showing the discharge determination processing.

FIG. 14 is a flow chart showing the discharge determination processing. At first, an image of one frame is obtained by the camera 72 (Step S401). The image processor 86 segments a partial region corresponding to the discharge determination region Rj from the obtained image (Step S402). The calculator 811 integrates the luminance value of each pixel constituting the discharge determination region Rj for each pixel column (Step S403). The calculator 811 further calculates the standard deviation σ of the luminance summation values as the evaluation value (Step S404).

The determiner 812 compares the value of the standard deviation σ as the evaluation value with the threshold value for discharge determination set in the preparatory processing beforehand (Step S405). If the value of the standard deviation σ is not smaller than the threshold value for discharge determination, the presence of the flow-down of the processing liquid from the nozzle 43 is determined (Step S406). If the evaluation value is below the threshold value for discharge determination, the absence of the flow-down of the processing liquid from the nozzle 43 is determined (Step S407). In this way, the presence or absence of the flow-down of the processing liquid is determined in the image of this frame. The above processing is repeated until a timing at which the discharge determination should be finished (Step S408) and the discharge determination is executed for an image of each frame.

Figure 15A:
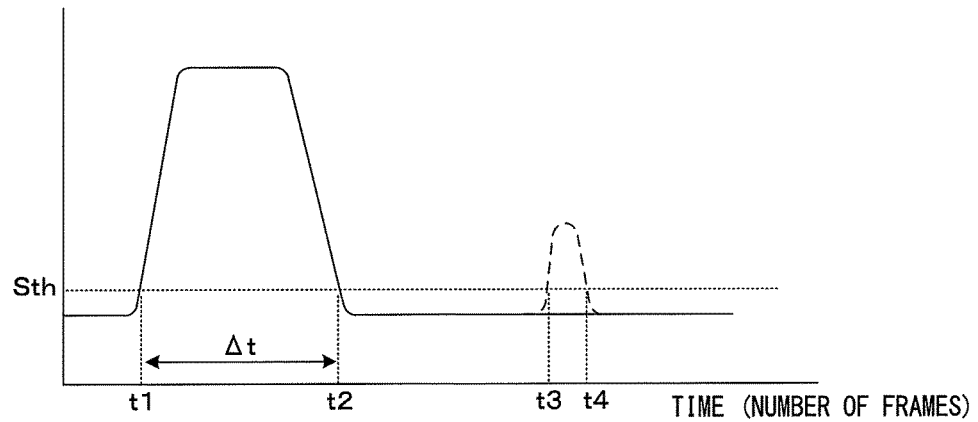
FIGS. 15A and 15B are graphs showing a change of the evaluation value frame by frame.
Figure 15B:
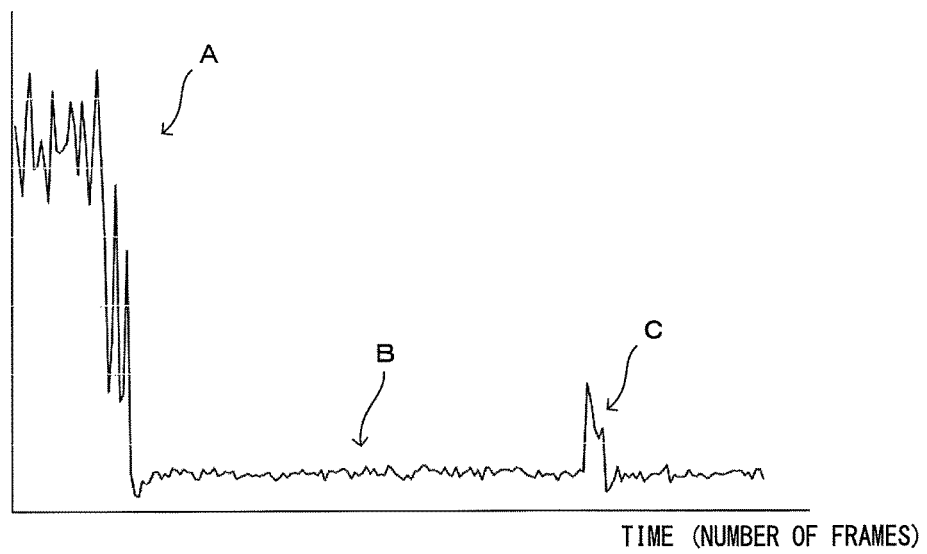

FIGS. 15A and 15B are graphs showing a change of the evaluation value frame by frame. More specifically, FIG. 15A is a graph schematically showing a relationship of the value of the standard deviation σ as the evaluation value obtained frame by frame and time (number of frames), and FIG. 15B is a graph showing an example of an actual measurement.

As shown in FIG. 15A, the threshold value for discharge determination Sth is set for the standard deviation σ of the luminance summation values as the evaluation value. At time t1, the value of the evaluation value reaches the threshold value Sth and the start of the discharge of the processing liquid is determined at this point of time. While the flow-down of the processing liquid continues, the evaluation value continues to be larger than the threshold value Sth. When the flow-down amount of the processing liquid decreases, the evaluation value also becomes smaller. When the evaluation value falls below the threshold value Sth at time t2, the stop of the discharge is determined. From these, the discharge timing of the processing liquid and the duration of the discharge (discharge period) are obtained. Specifically, times t1 and t2 respectively represent a start time and a stop time of the discharge of the processing liquid and a difference Δt of those represents the discharge period.

Whether or not the processing liquid has been properly supplied to the substrate W can be determined from these values. Specifically, a certain abnormality (e.g. nozzle clogging if the start of the discharge is not detected) is thought to have occurred in a liquid feeding system including the processing liquid supplier 84 and the nozzle 43 such as if the start of the discharge is not detected even upon the elapse of a predetermined time from a discharge start instruction, if the stop of the discharge is detected before a discharge end instruction is given and if the discharge is not finished even upon the elapse of a predetermined time after the discharge end instruction. In these cases, the determiner 812 determines a discharge abnormality and the controller 80 executes appropriate exception processing such as notification of a corresponding message to the operator or the stop of the processing. Note that the processing may be continued after the detection of the abnormality is recorded.

Further, the discharge determination processing continues to be performed also after the discharge of the processing liquid for substrate processing is finished. During this time, no flow-down of the processing liquid is supposed to be detected, but it is possible during a short period (time t3 to time t4) that the evaluation value exceeds the threshold value Sth and the flow-down of the processing liquid is detected as shown by broken line. By detecting such flow-down, the drop of the processing liquid from the nozzle 43 at an unexpected timing, i.e. the occurrence of the liquid drop phenomenon can be detected.

In the example of the actual measurement shown in FIG. 15B, there is a period during which a state where the evaluation value is high continues as indicated by a reference sign A. This corresponds to a state where the liquid column from the nozzle 43 toward the substrate W is formed by the discharge of the processing liquid for substrate processing. Thereafter, a state where the evaluation value is low continues as shown by a reference sign B. During this time, the discharge of the processing liquid from the nozzle 43 is stopped. Further, an increase of the evaluation value is seen, although for a short time, as indicated by a reference sign C. This corresponds to the liquid drop phenomenon.

In the case of the liquid drop phenomenon, its duration is irregular. For example, it is also possible that the liquid drop phenomenon appears only in an image of one frame. Since the discharge determination processing of this embodiment determines the presence or absence of the flow-down of the processing liquid from an individual frame image, if a droplet can be imaged at least in an image of one frame, the occurrence of the liquid drop phenomenon can be reliably detected.

As just described, in the discharge determination processing of this embodiment, the presence or absence of the flow-down of the processing liquid can be determined both from an image of a single frame and from the frames of images successively imaged. Further, a change of the flow-down state of the processing liquid can be grasped by synthesizing the determination results among a plurality of frames.

As described above, in this embodiment, the "flow-down determination method" of the invention is applied to the discharge determination processing. The substrate processing units 1A to 1D correspond to a "discharge apparatus" and a "flow-down determination apparatus" of the invention. The controller 80 has functions as a "controller" of the invention. The calculator 811 and the determiner 812 provided in the controller 80 respectively function as a "calculator" and a "determiner" of the invention. Further, the illuminator 71 and the camera 72 respectively function as an "illuminator" and an "imager" of the invention. Further, the nozzles 33, 43 and the 53 function as a "nozzle" of the invention, and the spin chuck 11 functions as a "holder" of the invention.

Further, in the above embodiment, the substrate W corresponds to a "work" of the invention and the processing liquid Lq corresponds to "liquid" of the invention. Further, the discharge determination region Rj corresponds to an "evaluation region" of the invention. Further, the luminance summation value S(i) in the above embodiment corresponds to a "total value of pixel values" in the invention. Further, in the above embodiment, the X direction and the Y direction respectively correspond to an "orthogonal direction" and a "flow-down direction" of the invention.

Note that the invention is not limited to the above embodiment and various changes other than those described above can be made without departing from the gist of the invention. For example, the camera 72 of the above embodiment continuously images at the fixed frame rate. However, for example, for the purpose of merely determining the presence or absence of the flow-down of the processing liquid at a certain time, there has only to be one still image at this time and continuous imaging is not necessary.

Further, in the above embodiment, the positioning of the nozzle 43 is regarded to be finished when the discharge of the processing liquid Lq from the nozzle 43 is started. However, the discharge determination is possible even if the nozzle 43 is not stopped if the position of the nozzle 43 necessary to set the discharge determination region Rj can be specified.

Further, in the above embodiment, the Y direction as one of the arrangement directions of the pixels constituting the image is matched with the flow-down direction of the liquid, i.e. the vertical direction. By doing so, the luminance summation value can be calculated for the pixels arranged in the Y direction and arithmetic processing can be simplified. However, even for an image in which the arrangement direction of the pixels and the flow-down direction of the liquid do not match, effects similar to those described above can be obtained by extracting the pixels arranged in a line along the flow-down direction and calculating the total value of the luminance values or by converting the coordinates of the image.

Further, in the above embodiment, the Y direction of the image and the flow-down direction of the liquid match and the discharge determination region Rj has a rectangular shape whose sides extend in the X and Y directions. Therefore, the number of the pixels constituting each pixel column along the Y direction is equal regardless of the X-direction position. Thus, the luminance summation values of the respective pixel columns can be simply compared in the X direction. On the other hand, if the numbers of the pixels constituting the pixel columns are not equal, correction such as normalization by dividing the luminance summation values by the numbers of pixels is necessary.

Further, in the above embodiment, the nozzle movement instruction and the processing liquid discharge instruction issued from the CPU 81 are executed in accordance with a sequence determined in advance to improve the throughput of the processing. Instead of this, such a process is also conceivable in which an advance is made to the next step while a state of the apparatus is confirmed in each step such as the issuance of a discharge instruction after the confirmation of the position of the nozzle. The flow-down determination method according to the invention effectively functions also in such a process.

Further, the substrate processing unit 1A and the like of the above embodiment include the spin chuck 11 for holding the substrate W as the work, the nozzle 43 and the like and are capable of performing the wet processing on the substrate W. However, these are not essential requirements in the "flow-down determination apparatus" of the invention.

Further, the substrate processing unit 1A and the like of the above embodiment are incorporated with the discharge deteimination processing, to which the flow-down determination method according to the invention is applied. However, it is also possible to apply the invention to a substrate processing apparatus not having such discharge determination processing by newly mounting a control program describing each process of the discharge determination processing in the substrate processing apparatus. To this end, the flow-down determination method according to the invention may be provided as a control program described to cause a computer to execute each process thereof or a computer-readable recording medium recording this control program.

As the specific embodiment is illustrated and described above, the evaluation region in the flow-down determination method according to the invention may include at least a part of the flow-down path in the flow-down direction and include a region wider than the flow-down path in the orthogonal direction. According to this configuration, when liquid flowing down along the flow-down path is present, a luminance change due to that reliably appears in the evaluation region. Further, since the background part outside the flow-down path is included in the evaluation region in the orthogonal direction, the luminance change in the presence of the flow-down of the liquid can be more reliably detected in comparison to the background part. By these, the presence or absence of the flow-down of the liquid can be more reliably determined.

Further, for example, the presence of the flow-down of the liquid may be determined if an evaluation value indicating a variation amount of the total value in the orthogonal direction is larger than a predetermined threshold value and the absence of the flow-down of the liquid may be determined if the evaluation value is smaller than the threshold value. By representing a variation of the total value of the pixel values along the flow-down direction by the evaluation value and executing the determination by the comparison of that value and the threshold value, it is possible to execute a quantitative and stable determination.

In this case, for example, a value of a standard deviation of a population composed of the total values obtained for the respective pixel columns can be set as the evaluation value. When the total values of the pixel values of the respective pixel columns largely vary in the orthogonal direction, the standard deviation between those values becomes larger. On the other hand, if there is no large variation, the value of the standard deviation becomes smaller. As just described, the value of the standard deviation obtained with the total values of the pixel values of the respective pixel columns as the population is an index quantitatively showing a change mode of the total values in the orthogonal direction and effective as the evaluation value.

Further, the invention can directly determine a flow-down state of the liquid from one image without using another reference image. Accordingly, for example, based on an image, which is a still image of one frame, the presence or absence of the flow-down of the liquid at a time at which the image is imaged may be determined. In such a configuration, the flow-down state of the liquid at this imaging time can be determined from a still image imaged at an arbitrary timing.

Further, a change of the flow-down state of the liquid may be determined, for example, based on a plurality of images imaged at times different from each other. By determining the flow-down state of the liquid in each of the plurality of images and comparing the determination results among the images, how the flow-down state of the liquid has changed with time can be known.

Further, for example, imaging may be performed while the flow-down path is irradiated with illumination light and an illumination light emission direction may be set to include a part of the liquid illuminated with the illumination light in an imaging field of view when the liquid flows down from the nozzle. According to such a configuration, since the liquid is illuminated with the illumination light to be brightly luminous when being present in the flow-down path, a luminance difference from the case where the liquid is absent can be made more notable and the presence or absence of the flow-down can be more reliably detected.

Further, for example, the imager may image an image in which a plurality of pixels are arranged in a matrix along two mutually orthogonal directions, and one of the two directions may be matched with the flow-down direction. According to such a configuration, a direction of the pixel column for which the pixel values should be totaled extends along the arrangement of the pixels in the image. Thus, arithmetic processing in totaling the pixel values can be simplified.

Further, in the discharge apparatus according to the invention, a determination is possible even if the nozzle is not stopped during imaging since the flow-down state of the liquid is determined from an image of one frame. Thus, the invention particularly effectively functions when the nozzle is configured to be movable above the work.

In this case, a controller may be provided which controls the discharge of the liquid from the nozzle and the controller may determine an abnormality of the nozzle based on the determination result of the flow-down determiner. Since the flow-down state of the liquid from the nozzle can be determined by the invention, whether or not the operation of the nozzle is proper can be determined from that determination result.

This invention can be suitably applied, for example, to a processing apparatus for performing wet processing by supplying processing liquid to a substrate. However, the invention can be applied to determine a flow-down state of liquid flowing down toward any arbitrary work without limitation to substrates.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. In a substrate processing apparatus in which processing is performed by supplying liquid downward to a work such as a substrate, a flow-down determination method for determining a flow-down state of the liquid from a nozzle to the work, comprising:

performing imaging with a camera, such that a flow-down path of the liquid from the nozzle arranged above the work to an upper surface of the work is included in an imaging field of view;

calculating with a processor a total value of pixel values of pixels belonging to each pixel column composed of the pixels arranged in a line along a flow-down direction of the liquid in an evaluation region corresponding to the flow-down path out of an imaged image; and determining presence or absence of the flow-down of the liquid based on a change mode of the total value in an orthogonal direction orthogonal to the flow-down direction;

wherein the presence of the flow-down of the liquid is determined if an evaluation value indicating a variation amount of the total value in the orthogonal direction is larger than a predetermined threshold valve and the absence of the flow-down of the liquid is determined if the evaluation value is smaller than the threshold value;

and wherein the evaluation value is a value of a standard deviation of a population composed of the total values obtained for the respective pixel columns.

2. The flow-down determination method of claim 1, wherein the evaluation region includes at least a part of the flow-down path in the flow-down direction and includes a region wider than the flow-down path in the orthogonal direction.

3. The flow-down determination method of claim 1, wherein based on an image which is a still image of one frame, the presence or absence of the flow-down of the liquid at a time at which the still image is imaged is determined.

4. The flow-down determination method of claim 1, wherein a change of the flow-down state of the liquid is determined based on a plurality of images imaged at times different from each other.

5. The flow-down determination method of claim 1, wherein imaging is performed while the flow-down path is irradiated with illumination light and an illumination light emission direction is set to include a part of the liquid illuminated with the illumination light in an imaging field of view when the liquid flows down from the nozzle.

\* \* \* \* \*